(12) United States Patent
Peng

(10) Patent No.: US 9,524,878 B2
(45) Date of Patent: Dec. 20, 2016

(54) LINE LAYOUT AND METHOD OF SPACER SELF-ALIGNED QUADRUPLE PATTERNING FOR THE SAME

(71) Applicant: MACRONIX International Co., Ltd., Hsinchu (TW)

(72) Inventor: Chi-Sheng Peng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/505,131

(22) Filed: Oct. 2, 2014

(65) Prior Publication Data

US 2016/0099217 A1    Apr. 7, 2016

(51) Int. Cl.
- H01L 21/311    (2006.01)
- H01L 23/544    (2006.01)
- H01L 21/768    (2006.01)
- H01L 21/033    (2006.01)
- H01L 23/528    (2006.01)

(52) U.S. Cl.
CPC .... H01L 21/31111 (2013.01); H01L 21/76838 (2013.01); *H01L 21/0337* (2013.01); *H01L 23/528* (2013.01); *H01L 2924/0002* (2013.01)

(58) Field of Classification Search
USPC ..................................... 257/E23.01
See application file for complete search history.

(56) References Cited

U.S. PATENT DOCUMENTS

2008/0299465 A1* 12/2008 Bencher .............. H01L 21/0273
                                                                          430/5

* cited by examiner

*Primary Examiner* — Calvin Choi
*Assistant Examiner* — Xiaoming Liu
(74) *Attorney, Agent, or Firm* — J.C. Patents

(57) ABSTRACT

A line layout and a spacer self-aligned quadruple patterning method thereof are provided. The line layout includes a first line, a second line, a third line, and a fourth line. The second line and the third line are disposed between the first line and the fourth line. The first line, the second line, the third line, and the fourth line respectively extend in a first direction. An end segment of the second line and an end segment of the third line respectively include a first protrusion portions that extend in a second direction. The first protrusion portion of the end segment of the second line protrudes toward the first line. The first protrusion portion of the end segment of the third line protrudes toward the fourth line.

10 Claims, 12 Drawing Sheets

LINE LAYOUT AND METHOD OF SPACER SELF-ALIGNED QUADRUPLE PATTERNING FOR THE SAME

BACKGROUND OF THE INVENTION

Field of the Invention

The invention relates to a line layout and a line layout method and more particularly relates to a spacer self-aligned quadruple patterning (SAQP) process and a line layout.

2. Description of Related Art

Due to the decreasing sizes of semiconductor devices, exposure technology that uses extreme ultraviolet (EUV) having a short wavelength of 13.5 nm has been proposed. However, such exposure technology requires high equipment costs and is not applicable for mass production. Therefore, it is expected to use the spacer self-aligned double patterning (SADP) technology to overcome the problems of the EUV exposure technology.

The spacer self-aligned double patterning is a technique that forms spacers on the sidewall of the first mask pattern, forms the second mask pattern between the spacers, and then removes the spacers. Through self-aligned double patterning, the spacing can be reduced to half of the spacing of the general lithography and etching process.

In addition, spacer self-aligned quadruple patterning technology has been proposed for further reducing the spacing on the basis of the self-aligned double patterning. The spacer self-aligned quadruple patterning is a technique that performs the self-aligned double patterning twice. However, the lines fabricated by the self-aligned quadruple patterning technique usually have much smaller spacing between the line ends, which may result in improper electrical connection between the lines. As an attempt to solve the above problem, currently the lithography and etching process is carried out several times in the spacer self-aligned quadruple patterning process in most cases. The lithography and etching processes effectively increase the spacing between line ends but raise the production costs and the fabrication complexity.

In view of the above, a technique that can effectively increase the spacing between line ends with fewer lithography processes is desired.

SUMMARY OF THE INVENTION

The invention provides a line layout and a line layout method adapted for effectively increasing spacing between line ends with use of fewer lithography processes.

The invention provides a spacer self-aligned quadruple patterning method of a line layout. The spacer self-aligned quadruple patterning method includes the following. A core layer is formed, wherein the core layer includes: a body layer including an end portion extending in a first direction; a first auxiliary layer connected with the end portion of the body layer; and two second auxiliary layers connected with two sides of the first auxiliary layer and extending in a second direction. A first spacer is formed on a sidewall of the core layer. The core layer is removed. A second spacer and a third spacer are formed on sidewalls of the first spacer, wherein the second spacer is disposed in the third spacer and includes two first protrusion portions corresponding to the second auxiliary layers. The first spacer is removed. A portion of the second spacer and a portion of the first protrusion portions are removed to form a first line and a second line. A portion of the third spacer is removed and a pattern transfer process is performed to form a third line and a fourth line, wherein the first line and the second line are disposed between the third line and the fourth line.

In an embodiment of the invention, a spacing between an endpoint of an end segment of the first line and an endpoint of an end segment of the second line in the second direction and a spacing between an endpoint of an end segment of the third line and an endpoint of an end segment of the fourth line in the second direction are respectively greater than or equal to a sum of a width of the first spacer and a width of the third spacer.

In an embodiment of the invention, the double of a width of the second spacer is greater than or equal to a length of each of the second auxiliary layers in the first direction.

In an embodiment of the invention, the step of removing the portion of the second spacer and the portion of the first protrusion portions and the step of removing the portion of the third spacer include: removing the second spacer, the third spacer, and the first protrusion portions located in a predetermined area that has a U shape. The predetermined area covers the portion of the second spacer corresponding to a bottom portion and a lower sidewall of the first auxiliary layer, the portion of the third spacer around the portion of the second spacer, and the portion of the first protrusion portions.

In an embodiment of the invention, the second auxiliary layers includes: two first extension portions connected with two sides of the first auxiliary layer and extending in the second direction; and two second extension portions connected with two sides of the first auxiliary layer and extending in the second direction, wherein the second extension portions are located at the bottom portion of the first auxiliary layer.

In an embodiment of the invention, a spacing between each of the first extension portions and the adjacent second extension portion in the first direction is smaller than or equal to a sum of the double of the width of the first spacer and the double of the width of the third spacer.

In an embodiment of the invention, a length of the second extension portions in the first direction is greater than or equal to a length of the first extension portions in the first direction.

In an embodiment of the invention, the third spacer further includes two second protrusion portions that extend in the second direction and protrude toward the second spacer.

In an embodiment of the invention, the step of removing the portion of the second spacer and the portion of the first protrusion portions and the step of removing the portion of the third spacer include: removing the second spacer, the third spacer, and the second protrusion portions located in a predetermined area that has a U shape, wherein the predetermined area covers the portion of the second spacer corresponding to the bottom portion and the lower sidewall of the first auxiliary layer, the portion of the third spacer around the portion of the second spacer, and the portion of the second protrusion portions, and extends in the first direction to an edge of the first protrusion portions.

In an embodiment of the invention, a material of the second spacer and the third spacer includes silicon oxide, silicon nitride, or a combination thereof.

The invention further provides a line layout that includes: a first line, a second line, a third line, and a fourth line respectively extending in a first direction, wherein the second line and the third line are disposed between the first line and the fourth line, and wherein an end segment of the second line and an end segment of the third line respectively comprise a first protrusion portion that extend in a second direction. The first protrusion portion of the end segment of the second line protrudes toward the first line. The first protrusion portion of the end segment of the third line protrudes toward the fourth line In an embodiment of the invention, a spacing between an endpoint of an end segment of the first line and an endpoint of an end segment of the second line in the second direction is greater than or equal to a sum of a width of the first line and a spacing between an endpoint of an initial segment of the first line and an endpoint of an initial segment of the second line; and a spacing between an endpoint of an end segment of the fourth line and an endpoint of an end segment of the third line in the second direction is greater than or equal to a sum of a width of the fourth line and a spacing between an endpoint of an initial segment of the fourth line and an endpoint of an initial segment of the third line.

In an embodiment of the invention, a spacing between the endpoint of the end segment of the second line and the endpoint of the end segment of the third line in the second direction is greater than the spacing between the endpoint of the end segment of the first line and the endpoint of the end segment of the second line in the second direction and greater than the spacing between the endpoint of the end segment of the third line and the endpoint of the end segment of the fourth line in the second direction.

In an embodiment of the invention, the line layout further includes two islands. A first one of the two islands is between the first line and the first protrusion portion of the end segment of the second line. A second one of the two islands is between the fourth line and the first protrusion portion of the end segment of the third line.

In an embodiment of the invention, the end segment of the first line and the end segment of the fourth line respectively include two second protrusion portions that extend in the second direction. The two second protrusion portions of the end segment of the first line protrudes toward the second line. The two second protrusion portions of the end segment of the fourth line protrudes toward the third line.

In an embodiment of the invention, a length of the first protrusion portions in the second direction is greater than a length of the second protrusion portions in the second direction.

In an embodiment of the invention, the line layout further includes two islands. A first one of the two islands is between the second line and one of the two second protrusion portions of the end segment of the first line. A second one of the two islands is between the third line and one of the two second protrusion portions of the end segment of the fourth line.

The invention further provides a line layout that includes: a first line, a second line, a third line, and a fourth line each including an end segment having a stepped shape, wherein the second line and the third line are disposed between the first line and the fourth line is less than the number of steps of the end segments of the first line and the fourth line respectively, and the number of steps of the end segments of the second line and the third line is less than the number of steps of the end segments of the first line and the fourth line respectively.

In an embodiment of the invention, the steps of the end segment of the first line and the steps of the end segment of the second line are in the same trend, and the steps of the end segment of the second line and the steps of the end segment of the third line are in opposite trends.

In an embodiment of the invention, the first line, the second line, the third line, and the fourth line respectively extend in a first direction. The end segment of the second line and the end segment of the third line respectively include two first protrusion portions that extend in a second direction. The two first protrusion portions of the end segment of the second line protrudes toward the first line and the two first protrusion portions of the end segment of the third line protrudes toward the fourth line. The end segment of the first line and the end segment of the fourth line respectively comprise two second protrusion portions that extend in the second direction. The two second protrusion portions of the end segment of the first line protrudes toward the second line and the two second protrusion portions of the end segment of the fourth line protrudes toward the third line.

The end segment of the first line and the end segment of the fourth line respectively include two second protrusion portions that extend in the second direction and protrude toward the second line and the third line.

Based on the above, the invention utilizes the core layer formed with auxiliary layers that protrude toward two sides to effectively increase the spacing between the line ends with use of fewer lithography processes.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1G are schematic top views illustrating a line layout method according to the first embodiment of the invention. FIG. 2A to FIG. 2F are schematic cross-sectional views respectively taken along the lines A-A and B-B of FIG. 1A to FIG. 1F. FIG. 3A to FIG. 3G are schematic top views illustrating a line layout method according to the second embodiment of the invention. FIG. 4A to FIG. 4F are schematic cross-sectional views respectively taken along the lines C-C and D-D of FIG. 3A to FIG. 3F.

In the first and the second embodiments of the invention, a spacer self-aligned quadruple patterning method is performed for forming the line layout.

Figure 1A:
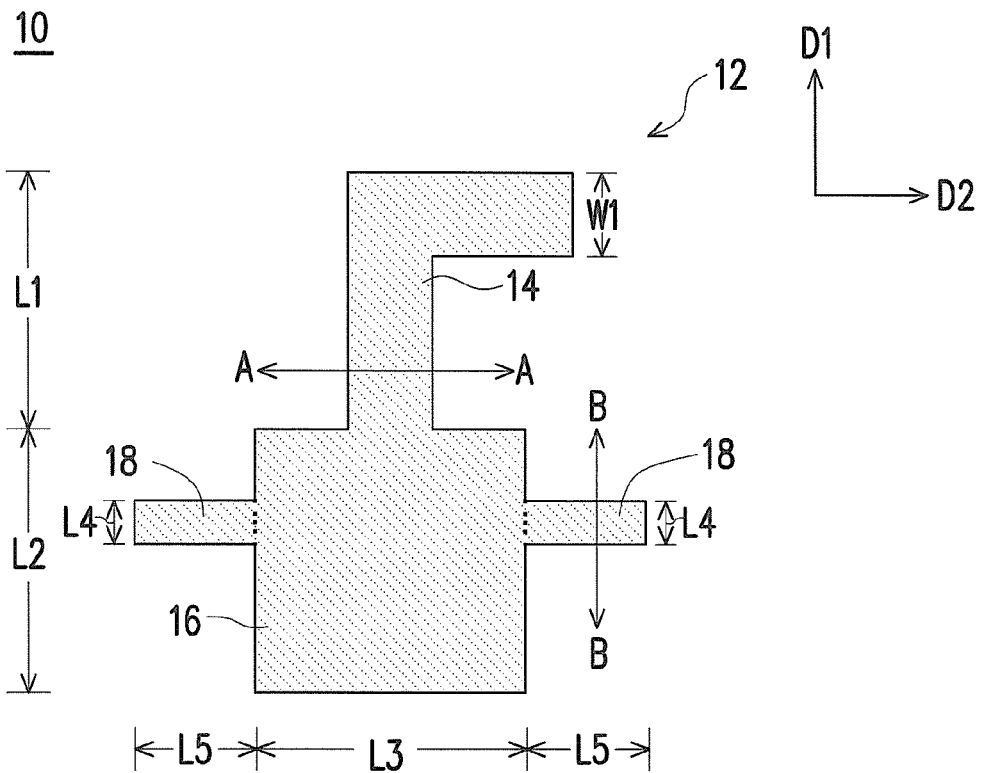
FIG. 1A to FIG. 1G are schematic top views illustrating a line layout method according to the first embodiment of the invention.
Figure 2A:
FIG. 2A to FIG. 2F are schematic cross-sectional views respectively taken along the lines A-A and B-B of FIG. 1A to FIG. 1F.

With reference to FIG. 1A and FIG. 2A, a core layer 10 is formed first. In an embodiment, the core layer 10 is formed by forming a core material layer (not shown) and then a photoresist trimming process is performed thereto. The core layer 10 includes: a body layer 12, a first auxiliary layer 16, and two second auxiliary layers 18. The body layer 12 includes an end portion 14 that extends in a first direction D1. The first auxiliary layer 16 and the end portion 14 of the body layer 12 are connected with each other. The two auxiliary layers 18 are connected with two sides of the first auxiliary layer 16 and extend in a second direction D2. The first direction D1 is a Y direction and the second direction D2 is an X direction, for example. A width W1 of the body layer 12 is in a range of 40 nm to 50 nm, for example. A length L1 of the end portion 14 of the body layer 12 in the first direction D1 is in a range of 100 nm to 3000 nm, for example. A length L2 of the first auxiliary layer 16 in the first direction D1 is greater than the width W1 of the body layer 12, and the length L2 is in a range of 150 nm to 400 nm, for example. A length L3 thereof in the second direction D2 is greater than the width W1 of the body layer 12, and the length L3 is in a range of 100 nm to 500 nm, for example. A length L4 of the second auxiliary layer 18 in the first direction D1 is in a range of 30 nm to 60 nm, for example. A length L5 thereof in the second direction D2 is in a range of 100 nm to 500 nm, for example. However, it should be noted that the lengths of the first auxiliary layer 16 and the second auxiliary layer 18 in the second direction D2 are not limited to the aforementioned ranges and may be varied according to the spacing desired. A material of the core layer 10 is a positive photoresist, a negative photoresist, or any material that can be used to form a pattern by a patterning process, for example. The core layer 10 is formed by forming a core material layer (not shown) and then performing a patterning process on the core material layer, for example. The patterning process may include exposing the formed core material layer by using yellow light, extreme ultraviolet light, ArF excimer laser, KrF excimer laser, etc., and then performing development.

Figure 1B:
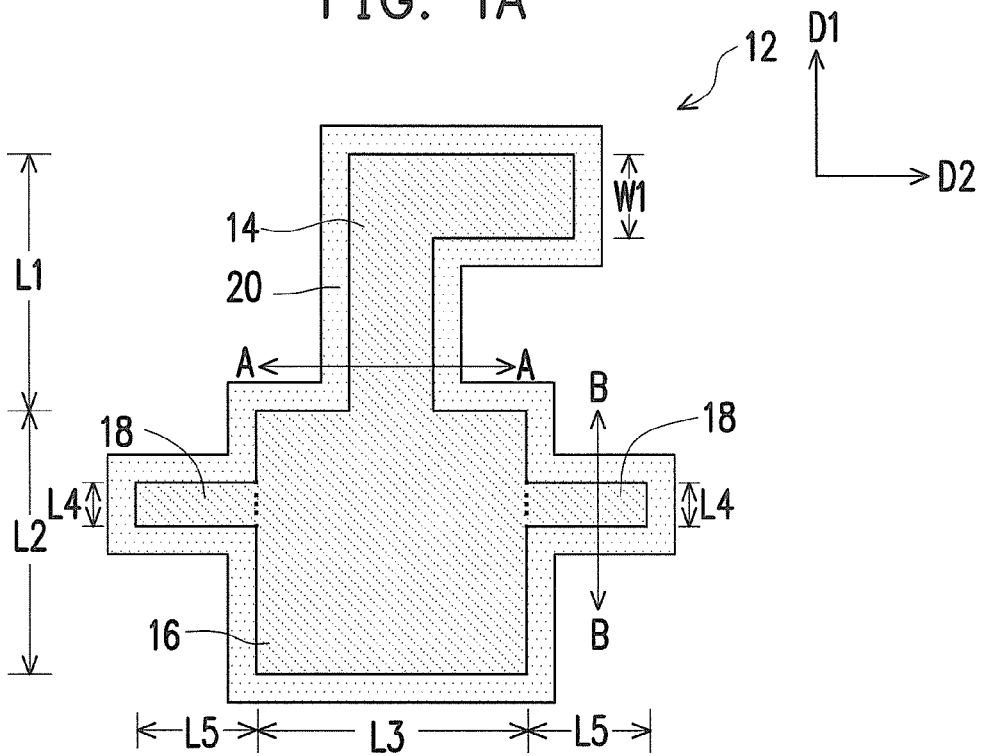
Figure 2B:

With reference to FIG. 1B and FIG. 2B, then, a first spacer 20 is formed on a sidewall of the core layer 10. A material of the first spacer 20 is silicon oxide, silicon nitride, or a combination thereof, for example. A width of the first spacer 20 is in a range of 15 nm to 30 nm, for example. The first spacer 20 is formed by forming a spacer material layer (not shown) and then performing an anisotropic etching process, for example.

Figure 1C:
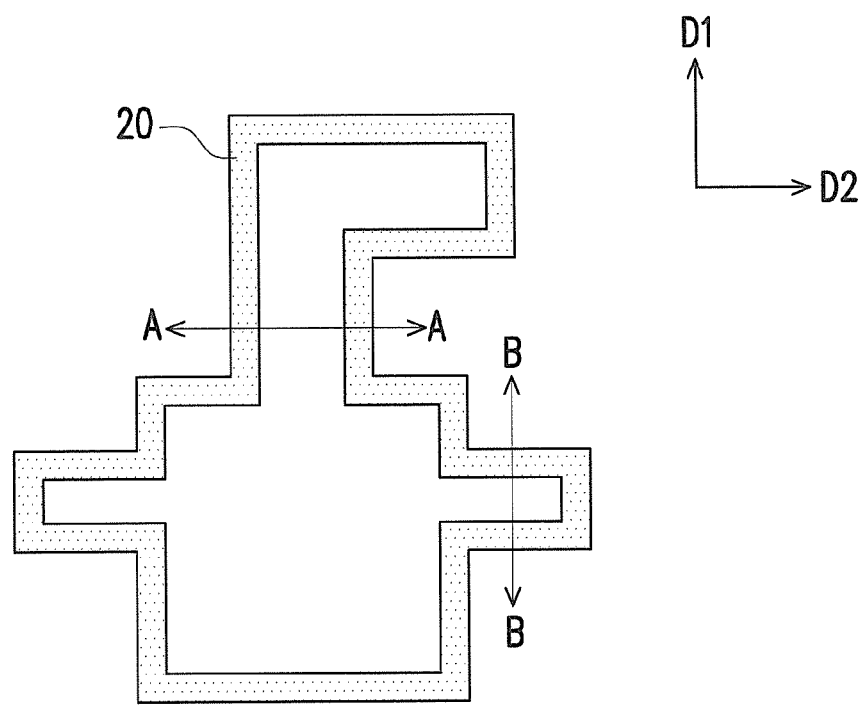
Figure 2C:

With reference to FIG. 1C and FIG. 2C, next, the core layer 10 is removed. A method of removing the core layer 10 may include performing a dry stripping process, a dry etching process, a wet stripping process, or a wet etching process.

Figure 1D:
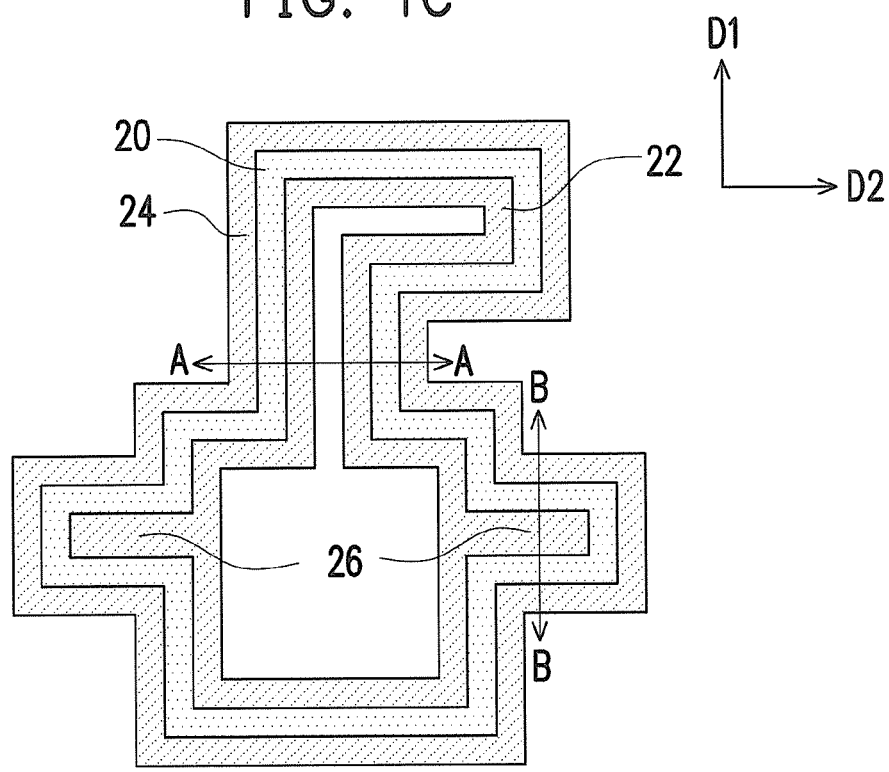
Figure 2D:
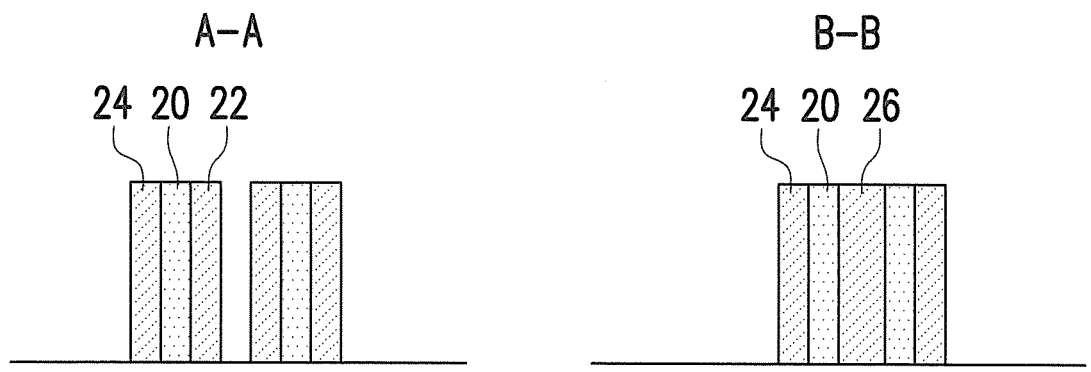

With reference to FIG. 1D and FIG. 2D, a second spacer 22 and a third spacer 24 are respectively formed on sidewalls of the first spacer 20. The second spacer 22 and the third spacer 24 form loops respectively. The second spacer 22 is located in the third spacer 24 and includes two first protrusion portions 26 corresponding to the second auxiliary layers 18 (FIG. 1A). A material of the second spacer 22 and the third spacer 24 may be different from the material of the first spacer 20. The material of the second spacer 22 and the third spacer 24 includes silicon oxide, silicon nitride, or a combination thereof. Widths of the second spacer 22 and the third spacer 24 are respectively in a range of 15 nm to 30 nm, for example. The widths of the first spacer 20, the second spacer 22, and the third spacer 24 may be the same or different from each other. In an embodiment, the double of the width of the second spacer 22 is greater than or equal to the length L4 of the second auxiliary layer 18 in the first direction D1. Accordingly, it is ensured that no gap exists in the first protrusion portion 26. A method of forming the second spacer 22 and the third spacer 24 may be the same as the forming method of the first spacer 20.

Figure 1E:
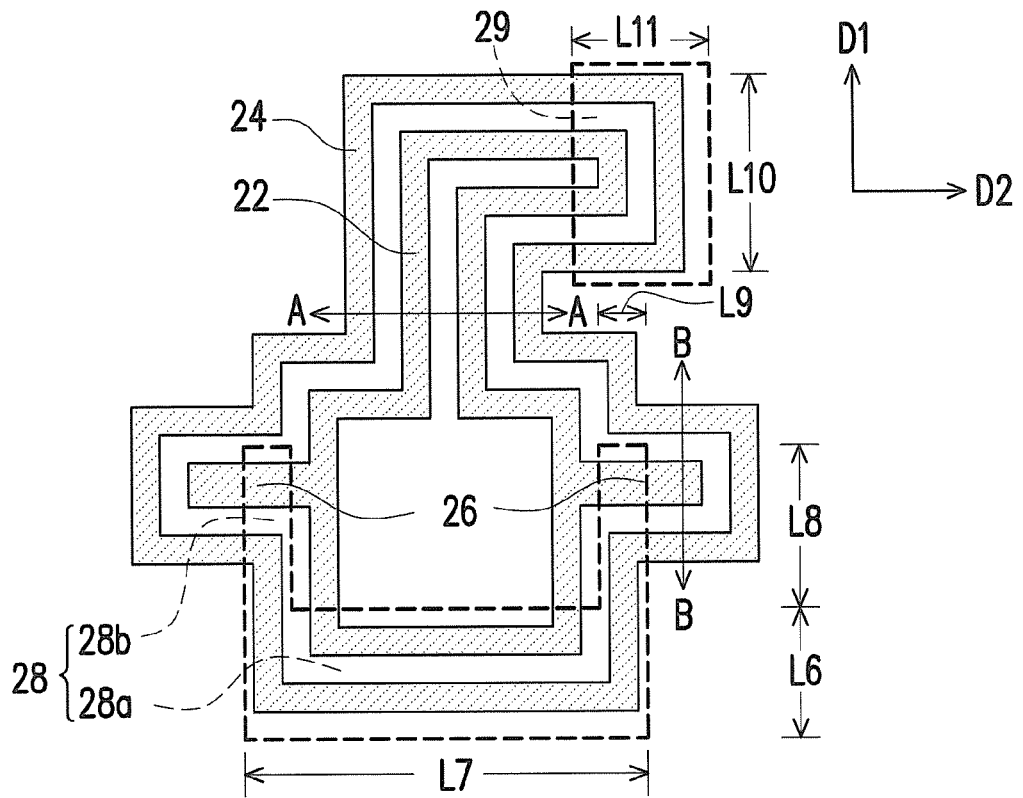
Figure 2E:
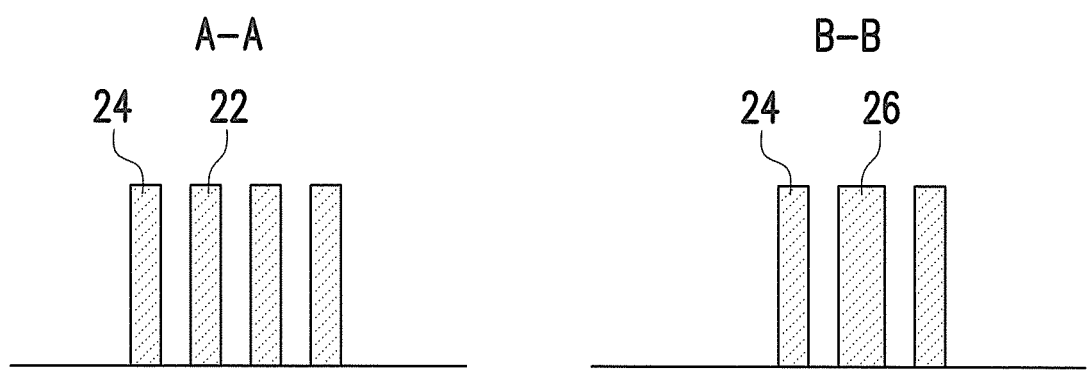

With reference to FIG. 1E and FIG. 2E, thereafter, the first spacer 20 is removed by performing an etching process. If the material of the first spacer 20 and the material of the second spacer 22 and the third spacer 24 are different from each other, an anisotropic etching process may be performed directly using the difference in etching rates of the materials.

With reference to FIG. 1E and FIG. 2E, next, a portion of the second spacer 22, a portion of the third spacer 24, and a portion of the first protrusion portions 26 located in a first predetermined area 28 and a second predetermined area 29 are removed, so as to cut two ends of the loop of the second spacer 22 and two ends of the loop of the third spacer 24. More specifically, the second spacer 22, the third spacer 24, and the first protrusion portions 26 in the first predetermined area 28 and the second spacer 22 and the third spacer 24 in the second predetermined area 29 are removed by performing an etching process.

The first predetermined area 28 has a U shape, for example, which corresponds to first ends of the loops of the second spacer 22 and the third spacer 24 and a portion of the first protrusion portions 26. More specifically, the first predetermined area 28 includes a bottom area 28a and an extension area 28b. The bottom area 28a extends in the second direction D2 and the extension area 28b extends in the first direction D1. The bottom area 28a of the first predetermined area 28 needs to completely cover the second spacer 22 corresponding to a bottom portion of the first auxiliary layer 16 (FIG. 1B) and a portion of the third spacer 24 around the second spacer 22, so as to ensure that the lines are formed with sufficient spacing therebetween. The extension area 28b of the first predetermined area 28 covers a portion of the second spacer 22 corresponding to the bottom portion and a lower sidewall of the first auxiliary layer 16 (FIG. 1B), a portion of the third spacer 24 around the portion of the second spacer 22, and a portion of the first protrusion portion 26. It should be noted that the extension area 28b of the first predetermined area 28 is disposed across the first protrusion portion 26 in the first direction D1, so as to ensure that the first protrusion portion 26 can be cut, thereby preventing short between the lines due to errors of a subsequent pad forming process. The size of the first predetermined area 28 may be varied as required as long as the first predetermined area 28 satisfies the aforementioned condition. A length L6 of the bottom area 28a of the first predetermined area 28 in the first direction D1 is in a range of 75 nm to 200 nm, and a length L7 thereof in the second direction D2 is in a range of 300 nm to 1500 nm, for example. A length L8 of the extension area 28b of the first predetermined area 28 in the first direction D1 is in a range of 130 nm to 500 nm, and a length L9 thereof in the second direction D2 is in a range of 50 nm to 450 nm, for example. The second predetermined area 29 corresponds to second ends of the loops of the second spacer 22 and the third spacer 24. The size of the second predetermined area 29 is not particularly limited as long as the lines are separated from each other. A length L10 of the second predetermined area 29 in the first direction D1 is in a range of 150 nm to 300 nm, and a length L11 thereof in the second direction D2 is in a range of 100 nm to 150 nm, for example.

Figure 1F:
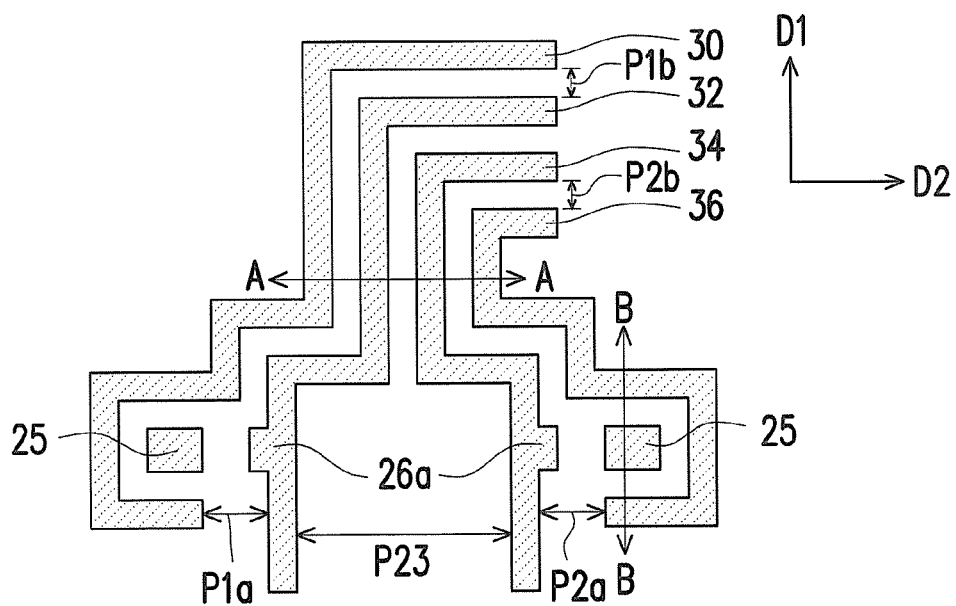
Figure 2F:
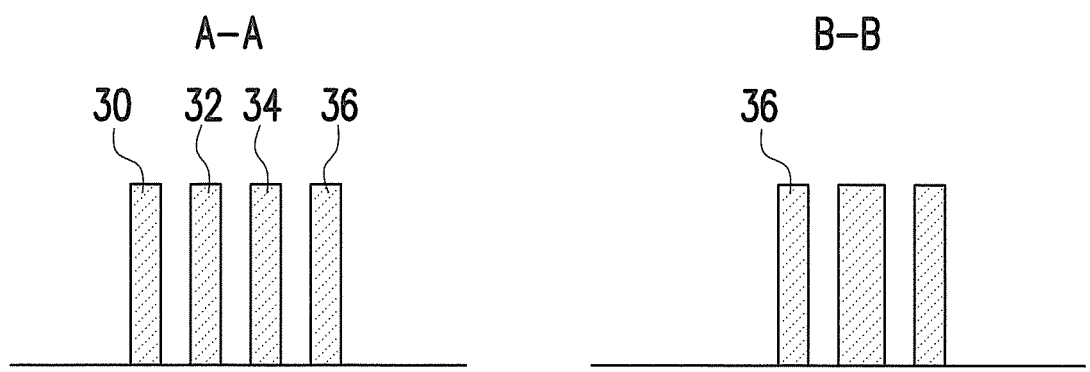

With reference to FIG. 1F and FIG. 2F, after the aforementioned removing process, a first line 30, a second line 32, a third line 34, and a fourth line 36 are formed by performing a pattern transfer process. According to adjustment of the location of the extension area 28b of the first predetermined area 28 or the length L9 thereof in the second direction D2, a first protrusion portion 26a and/or an island 25 may be further formed in addition to the first line 30 to the fourth line 36 after the aforementioned removing process and the aforementioned pattern transfer process. A spacing P1a between an endpoint of an end segment of the first line 30 and an endpoint of an end segment of the second line 32 in the second direction D2 and a spacing P2a between an endpoint of an end segment of the third line 34 and an endpoint of an end segment of the fourth line 36 are respectively greater than or equal to a sum of the width of the first spacer 20 and the width of the third spacer 24. A material of the first line 30 to the fourth line 36 includes a metal or a metal alloy, such as copper or copper-nickel alloy, for example.

Figure 1G:
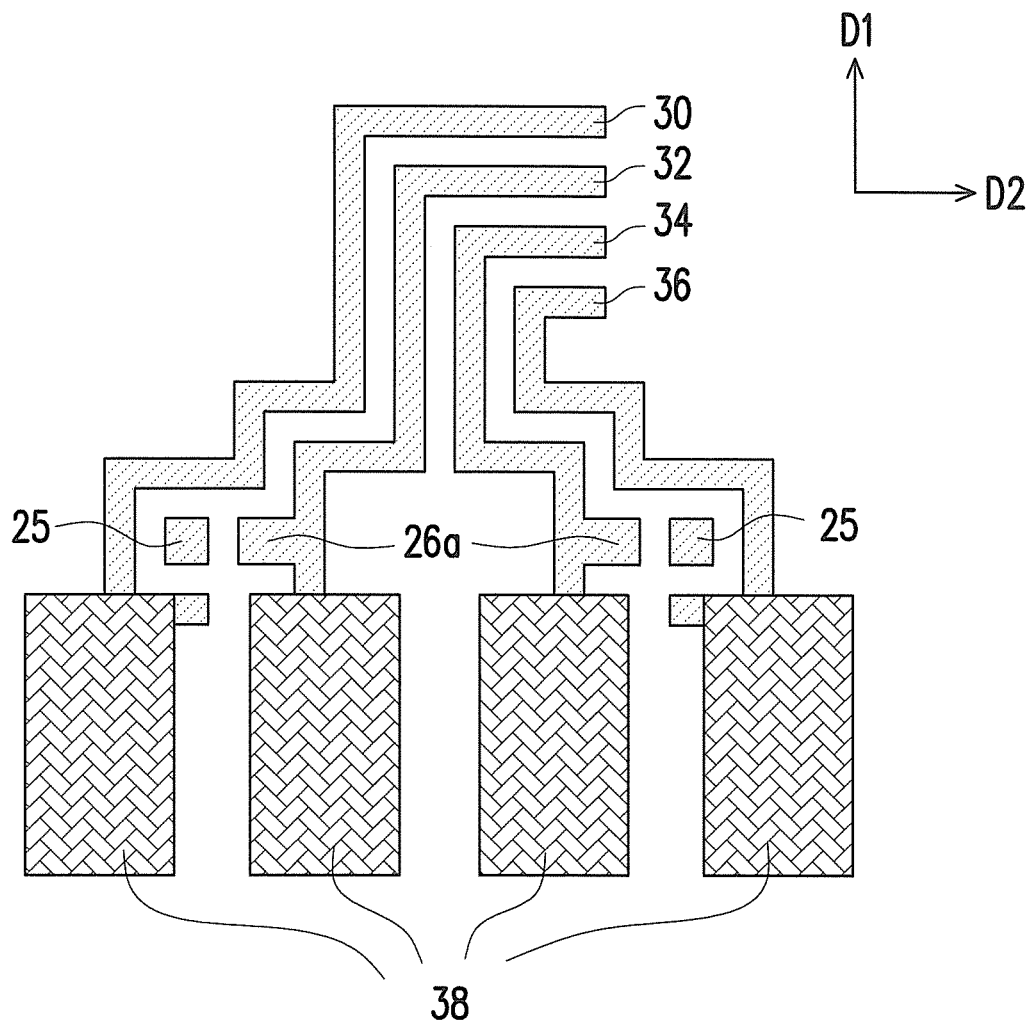

With reference to FIG. 1G, a plurality of pads 38 are further formed to be connected with the first line 30 to the fourth line 36 respectively. A material of the pads 38 includes a metal or a metal alloy, such as copper or copper-nickel alloy, for example. The pads 38 are formed by forming a pad material layer (not shown) by chemical vapor deposition or physical vapor deposition and then performing a lithography and etching process thereon.

With reference to FIG. 1F, FIG. 2F, and FIG. 1G, the line layout of the first embodiment of the invention includes the first line 30 to the fourth line 36 and the plurality of pads 38 respectively connected with the first line 30 to the fourth line 36. The first line 30 to the fourth line 36 extend in the first direction D1 respectively. The second line 32 and the third line 34 are disposed between the first line 30 and the fourth line 36. In an embodiment, the end segment of the second line 32 and the end segment of the third line 34 each include one first protrusion portion 26a that extends in the second direction D2 and protrudes toward the first line 30 and the fourth line 36 respectively. In another embodiment, the islands 25 are respectively formed between the first protrusion portion 26a and the first line 32 and between the first protrusion portion 26a and the fourth line 36. The lengths of the first protrusion portion 26a in the second direction D2 and the first direction D1 respectively correspond to the second auxiliary layer 18. The first protrusion portion 26a and the island 25 are characteristics of the line layout formed by the spacer self-aligned quadruple patterning method of the invention. When forming the pads 38 in the subsequent process, even if misalignment occurs in the longitudinal direction and results in contact between the pad 38 connected with the second line 32 and the first protrusion portion 26a or contact between the pad 38 connected with the first line 30 and the island 25, the fabrication is still within the tolerance range. Therefore, because of the first protrusion portion 26a and the island 25, the fabrication tolerance is improved.

The end segments of the first line 30 to the fourth line 36 connected with the pads 38 respectively have a stepped shape. The number of steps of the end segments of the second line 32 is less than the number of steps of the end segments of the first line 30 and the number of steps of the fourth line 36, and the number of steps of the third line 34 is less than the number of steps of the end segments of the first line 30 and the number of steps of the fourth line 36. The number of steps of the end segments of the second line 32 and the third line 34 is one respectively, and the number of steps of the end segments of the first line 30 and the fourth line 36 is two respectively, for example. In other words, the number of steps of the end segments of the second line 32 and the third line 34 is less than the number of steps of the end segments of the first line 30 and the fourth line 36 for one step. In addition, the steps of the end segments of the first line 30 and the second line 32 are connected with the pads 38 in a −X direction; and the steps of the end segments of the third line 34 and the fourth line 36 are connected with the pads 38 in an X direction. Simply put, the steps of the end segment of the first line 30 and the steps of the end segment of the second line 32 are in a trend while the steps of the end segment of the third line 34 and the steps of the end segment of the fourth line 36 are in another trend. However, the trend of the former two steps is opposite to the another trend of the latter two steps. It should be noted that the trend of the steps of the end segment of the second line 32 is opposite to the trend of the steps of the end segment of the third line 34. Therefore, a spacing P23 between the endpoint of the end segment of the second line 32 and the endpoint of the end segment of the third line 34 in the second direction D2 is greater than the spacing P1a between the endpoint of the end segment of the first line 30 and the endpoint of the end segment of the second line 32 in the second direction D2, and greater than the spacing P2a between the endpoint of the end segment of the third line 34 and the endpoint of the end segment of the fourth line 36 in the second direction D2. Thus, sufficient space is provided for disposing the pad 38 connected with the second line 32 and the pad 38 connected with the third line 34, and the fabrication tolerance is increased.

In addition, the spacing P1a between the endpoint of the end segment of the first line 30 and the endpoint of the end segment of the second line 32 in the second direction D2 is greater than or equal to a sum of the width of the first line 30 and a spacing P1b between an endpoint of an initial segment of the first line 30 and an endpoint of an initial segment of the second line 32. The spacing P2a between the endpoint of the end segment of the fourth line 36 and the endpoint of the end segment of the third line 34 in the second direction D2 is greater than or equal to a sum of the width of the fourth line 36 and a spacing P2b between an endpoint of an initial segment of the fourth line 36 and an endpoint of an initial segment of the third line 34. The spacing P1a is in a range of 65 nm to 465 nm, for example. The spacing P2a is in a range of 65 nm to 465 nm, for example. The spacings P1b and P2b are respectively in a range of 15 nm to 30 nm, for example. Because the spacings P1a and P2a are greater than the spacings P1b and P2b, when the pads 38 are formed, sufficient fabrication tolerance is provided.

The second embodiment of the invention is explained below. In the following paragraphs, descriptions of components identical to or similar to those of the first embodiment will not be repeated.

Figure 3A:
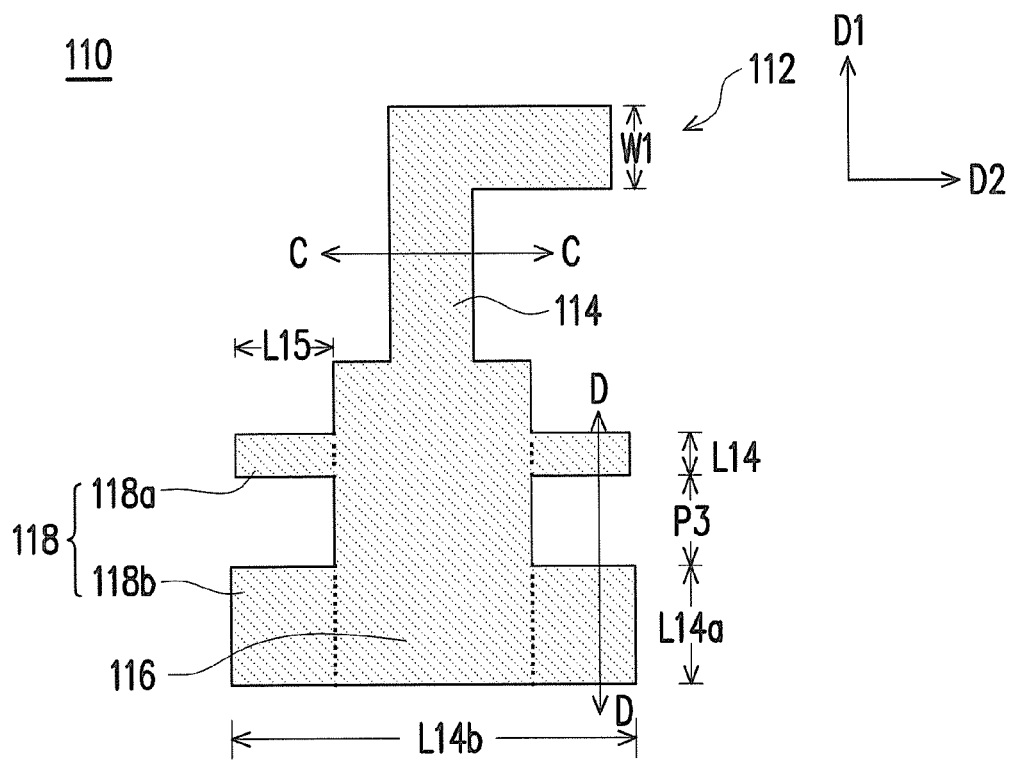
FIG. 3A to FIG. 3G are schematic top views illustrating a line layout method according to the second embodiment of the invention.
Figure 3B:
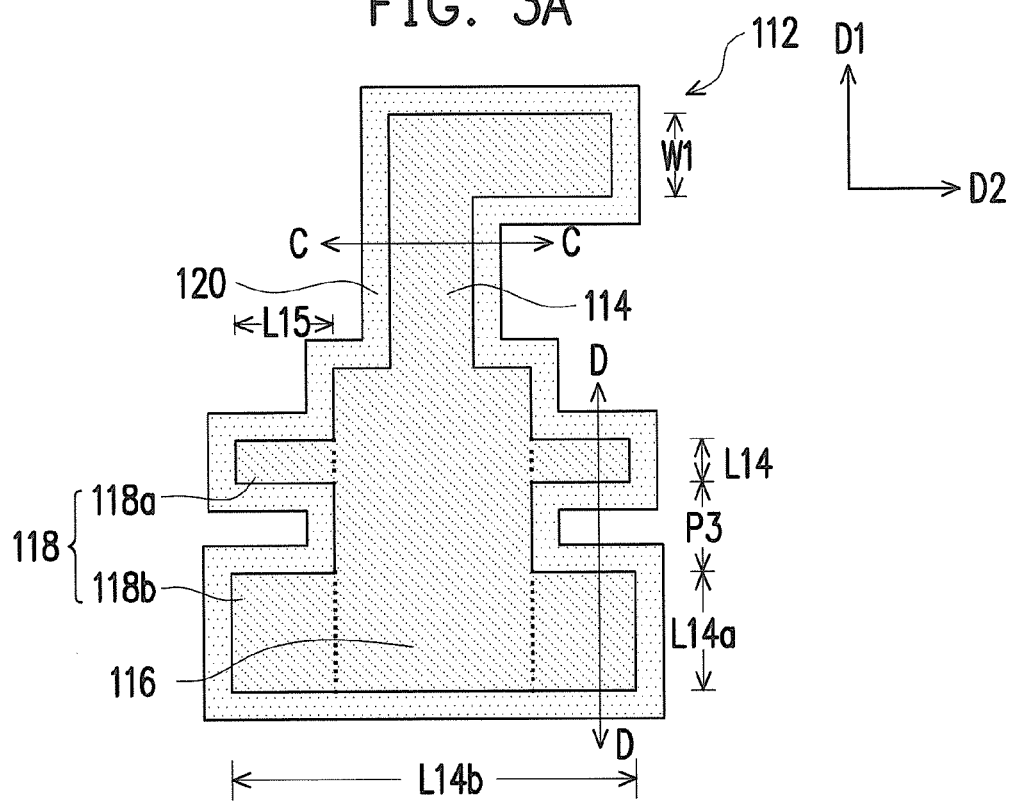
Figure 3C:
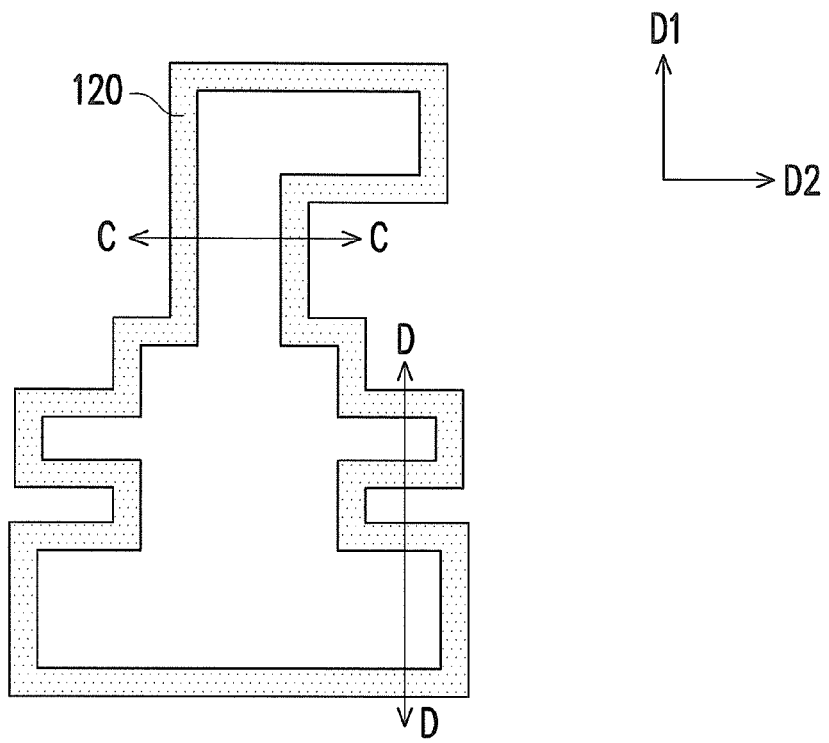
Figure 3D:
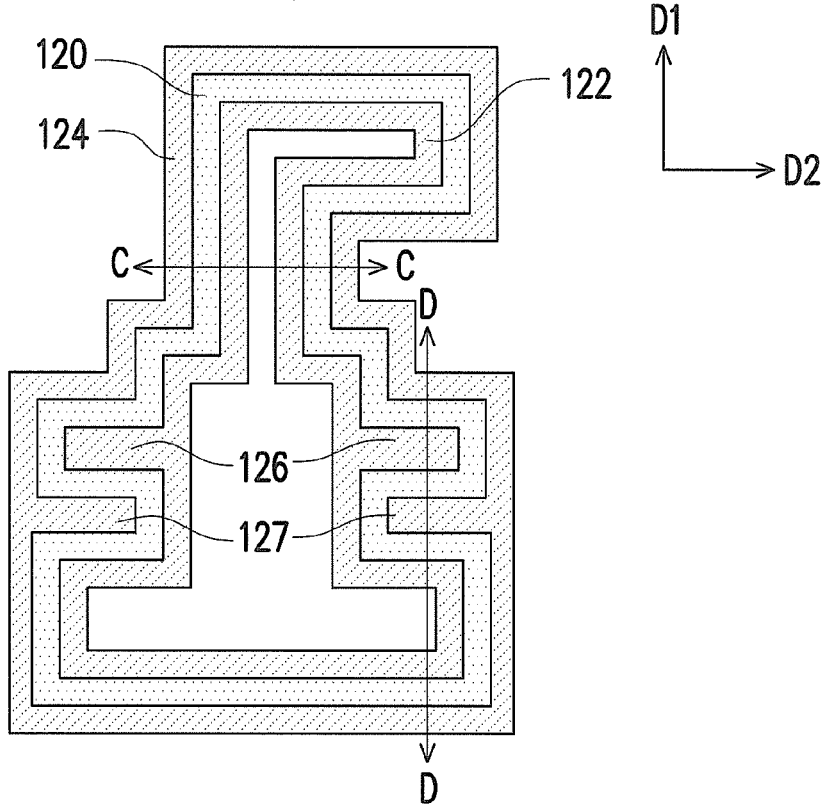
Figure 3E:
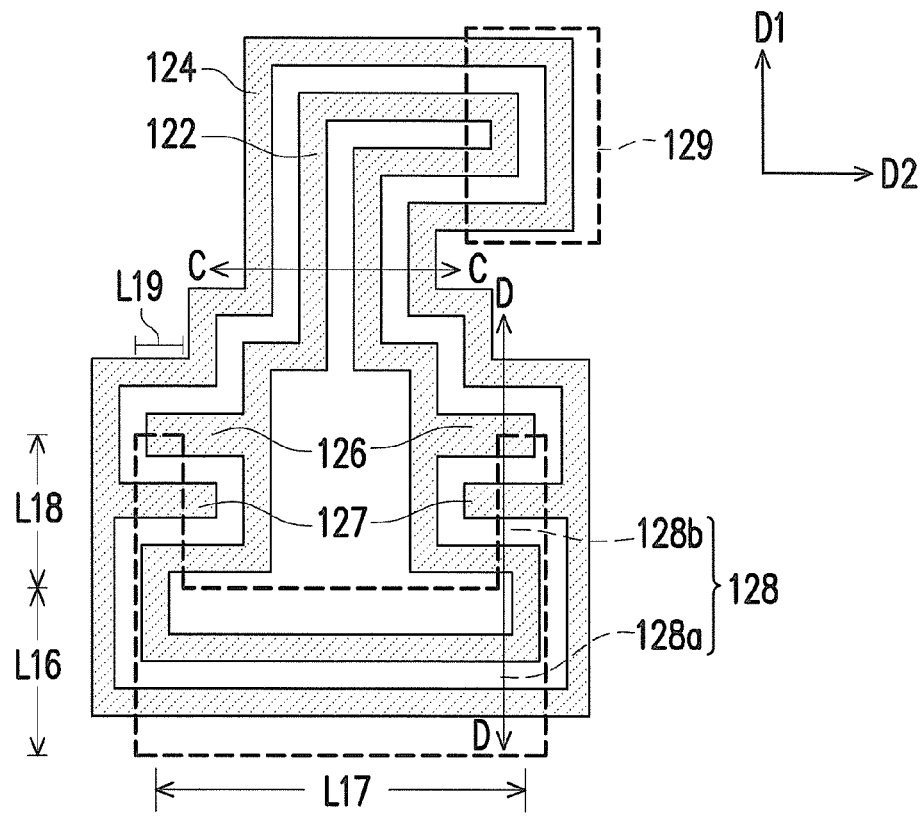
Figure 4A:
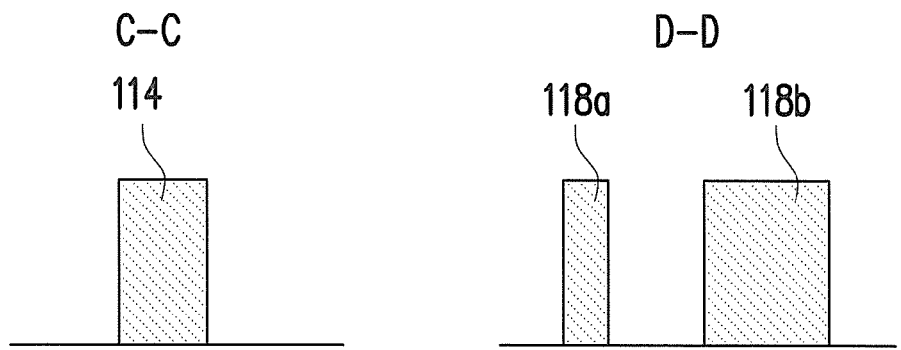
FIG. 4A to FIG. 4F are schematic cross-sectional views respectively taken along the lines C-C and D-D of FIG. 3A to FIG. 3F.
Figure 4B:
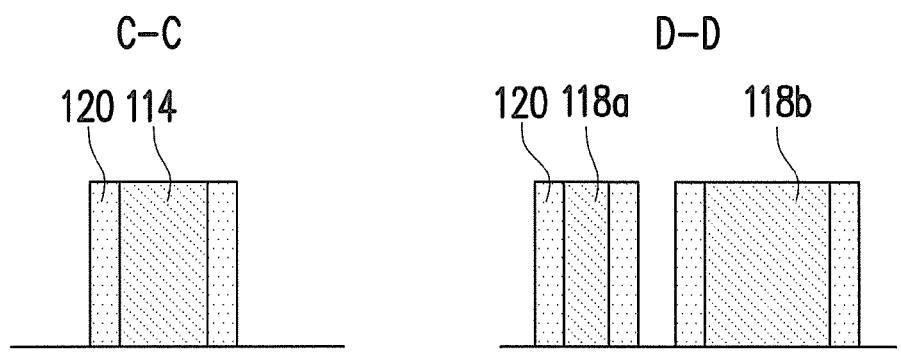
Figure 4C:
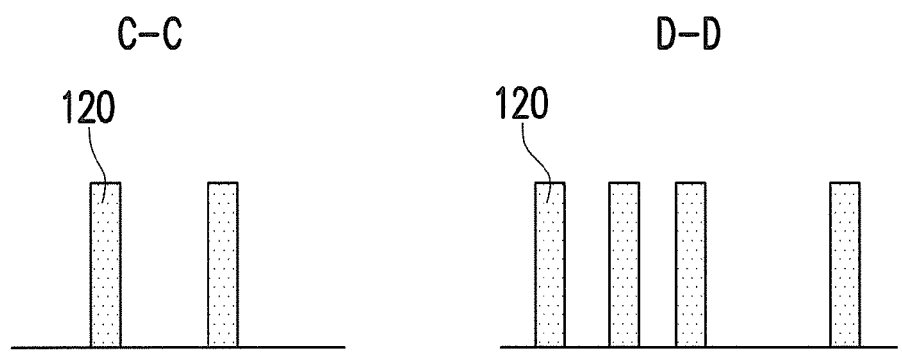
Figure 4D:
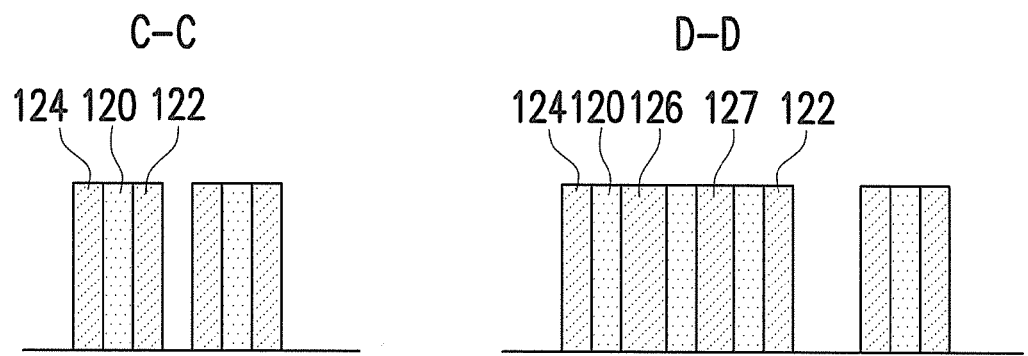
Figure 4E:
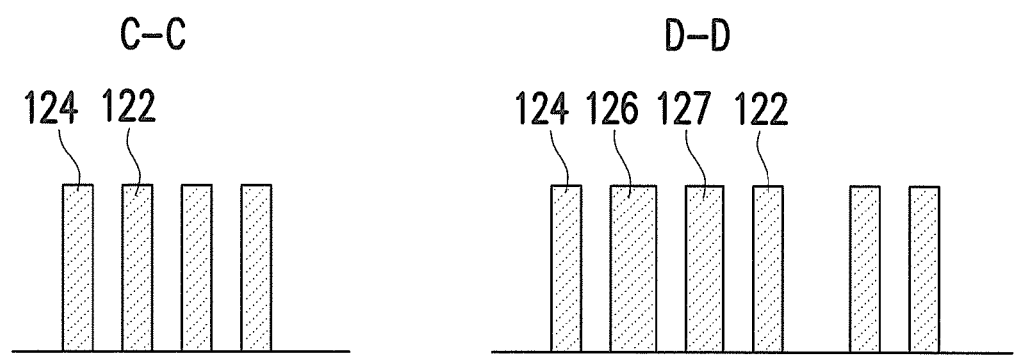

With reference to FIG. 3A and FIG. 4A, a core layer 110 is formed first. The core layer 110 includes: a body layer 112, a first auxiliary layer 116, and two second auxiliary layers 118. The body layer 112 includes an end portion 114 that extends in a first direction D1. The first auxiliary layer 116 and the end portion 114 of the body layer 112 are connected with each other. What differentiates the second embodiment from the first embodiment is that, in the second embodiment, the two second auxiliary layers 118 include two first extension portions 118a and two second extension portions 118b. The two first extension portions 118a are connected with two sides of the first auxiliary layer 116 and extend in a second direction D2. The two second extension portions 118b are connected with two sides of the first auxiliary layer 116 and extend in the second direction D2, wherein the first extension portions 118a are disposed on sidewalls of the first auxiliary layer 116 and the second extension portions 118b are disposed on a bottom portion of the sidewalls of the first auxiliary layer 116. A length L14 of the first extension portion 118a in the first direction D1 is in a range of 30 nm to 60 nm, and a length L15 thereof in the second direction D2 is in a range of 100 nm to 500 nm, for example. A length L14a of the second extension portion 118b in the first direction D1 is in a range of 150 nm to 200 nm, and a total length L14b of the two second extension portions 118b and the first auxiliary layer 116 in the second direction D2 is in a range of 300 nm to 1500 nm, for example. In an embodiment, the length L14a of the second extension portion 118b in the first direction D1 is greater than or equal to the length L14 of the first extension portion 118a in the first direction D1. Further, it should be noted that the lengths of the first auxiliary layer 116, the first extension portion 118a, and the second extension portion 118b in the second direction D2 are not limited to the aforementioned ranges and may be varied according to the spacing desired. Moreover, although this embodiment illustrates that the two second auxiliary layers 118 include two sets of extension portions, the invention is not limited thereto. Those skilled in the art may form two or more sets of extension portions as required. With the exception of the above, the second embodiment may be the same as the first embodiment in terms of the material of the core layer 110, the size range of the body layer 112, the size range of the first auxiliary layer 116, and the forming method of the core layer 110. Thus, details thereof are not repeated here.

With reference to FIG. 3B, FIG. 4B, FIG. 3C, FIG. 4C, FIG. 3D, and FIG. 4D, then, a process of forming a first spacer 120, a process of removing the core layer 110, and a process of forming a second spacer 122 and a third spacer 124 are performed in sequence in the same manner as the first embodiment. With reference to FIG. 3B, FIG. 3D, FIG. 4B, and FIG. 4D, in an embodiment, the double of a width of the second spacer 122 is greater than or equal to the length L14 of the first extension portion 118a in the first direction D1, and a spacing P3 between each first extension portion 118a and the adjacent second extension portion 118b in the first direction D1 is smaller than or equal to a sum of the double of a width of the first spacer 120 and the double of a width of the third spacer 124. Accordingly, it is ensured that no gap exists in two first protrusion portions 126 and two second protrusion portions 127. It should be noted that the third spacer 124 further includes the two second protrusion portions 127 that extend in the second direction D2 and protrude toward the second spacer 122. With the exception of the above, the second embodiment may be the same as the first embodiment in terms of the material of the first spacer 120, the width of the first spacer 120, the material of the second spacer 122 and the third spacer 124, and the widths of the second spacer 122 and the third spacer 124. Details thereof will not be repeated here.

With reference to FIG. 3E, FIG. 3F, FIG. 4E, and FIG. 4F, thereafter, a portion of the second spacer 122, a portion of the third spacer 124, and a portion of the second protrusion portion 127 are removed in the same manner as the first embodiment to cut two ends of a loop of the second spacer 122 and two ends of a loop of the third spacer 124.

What differentiates the second embodiment from the first embodiment is that, in the second embodiment, the second spacer 122, the third spacer 124, and the second protrusion portion 127 that are located in a U-shaped first predetermined area 128 and the second spacer 122 and the third spacer 124 that are located in a second predetermined area 129 are removed. More specifically, the U-shaped first predetermined area 128 includes a bottom area 128a and an extension area 128b. The bottom area 128a extends in the second direction D2 and the extension area 128b extends in the first direction D1. The bottom area 128a of the first predetermined area 128 needs to completely cover a portion of the second spacer 122 corresponding to the bottom portion of the first auxiliary layer 116 and a portion of the third spacer 124 around the portion of the second spacer 122, so as to ensure that the lines are formed with sufficient spacing therebetween. The extension area 128b of the first predetermined area 128 covers a portion of the second spacer 122 corresponding to the bottom portion and the lower sidewall of the first auxiliary layer 116 and a portion of the second protrusion portion 127 around the portion of the second spacer 122, and extends to an edge of the first protrusion portion 126 in the first direction D1. It should be noted that the extension area 128b of the first predetermined area 128 is disposed at least across the second protrusion portion 127 in the first direction D1 or even extends over a portion of the first protrusion portion 126, so as to ensure that the second protrusion portion 127 is cut in the second direction D2, thereby preventing short between the lines due to errors in the subsequent process of forming the pads. The size of the first predetermined area 128 may be varied as required as long as the first predetermined area 128 satisfies the aforementioned condition. By forming the first protrusion portion 126 and the second protrusion portion 127, tolerance of errors in the process of removing the portion of the second spacer 122, the portion of the third spacer 124, and the portion of the second protrusion portion 127 is enhanced effectively. A length L16 of the bottom area 128a of the first predetermined area 128 in the first direction D1 is in a range of 150 nm to 300 nm, and a length L17 thereof in the second direction D2 is in a range of 355 nm to 2455 nm, for example. A length L18 of the extension area 128b of the first predetermined area 128 in the first direction D1 is in a range of 120 nm to 150 nm, and a length L19 thereof in the second direction D2 is in a range of 50 nm to 450 nm, for example. The size range of the second predetermined area 129 in the second embodiment is the same as the size range of the second predetermined area 29 in the first embodiment. Thus, details thereof are not repeated here.

Figure 3F:
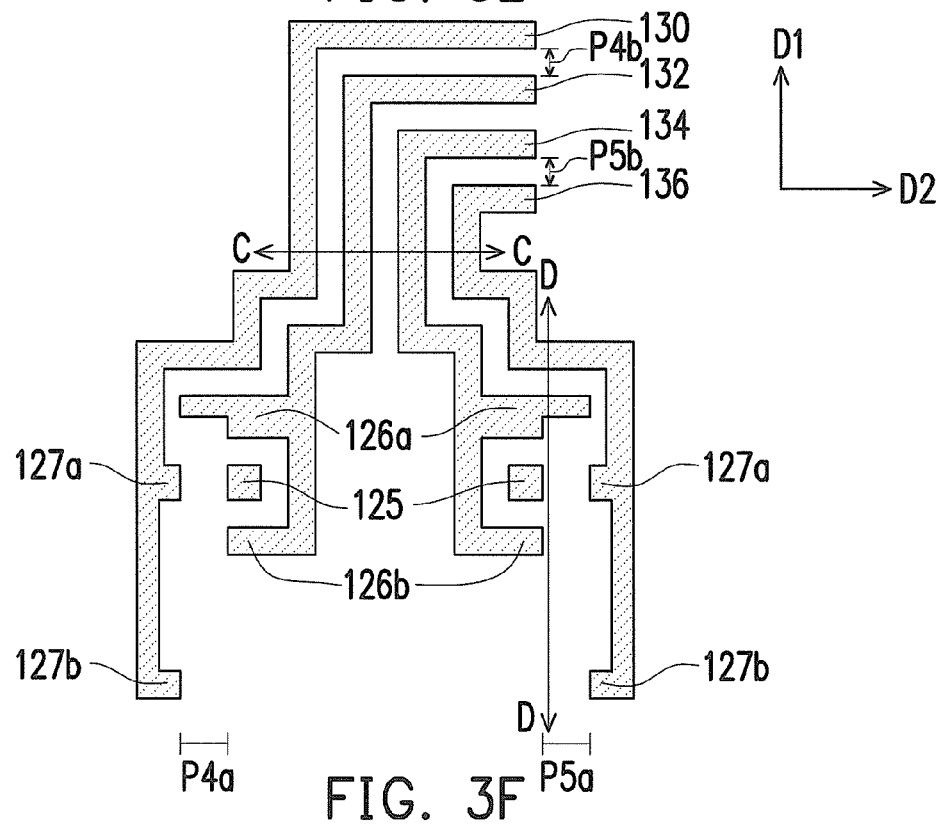
Figure 3G:
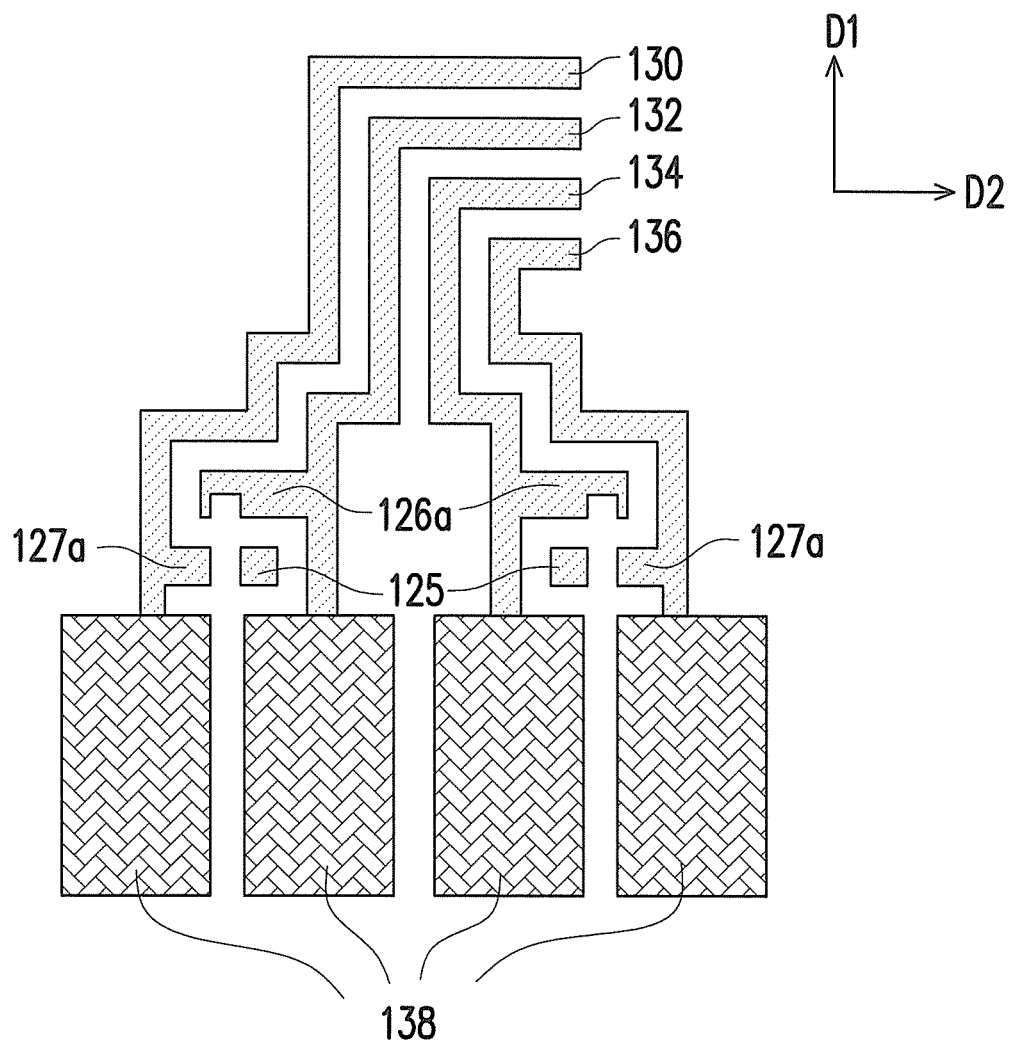
Figure 4F:
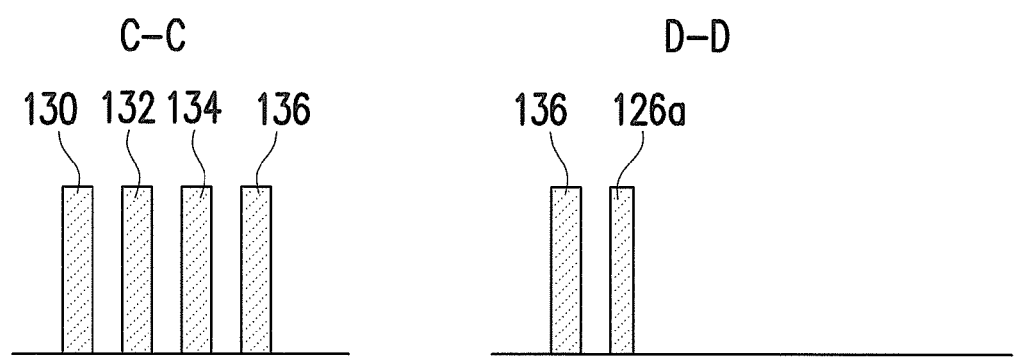

With reference to FIG. 3F and FIG. 4F, next, a first line 130, a second line 132, a third line 134, and a fourth line 136 are formed by performing a pattern transfer process. With reference to FIG. 1E, by adjusting the location of the extension area 128b of the first predetermined area 128 or the length L19 thereof in the second direction D2, the second line 132 and the third line 134 further include first protrusion portions 126a and 126b; and the first line 130 and the fourth line 136 further include second protrusion portions 127a and 127b in addition to the formation of the first line 130 to the fourth line 136 after the aforementioned removing process and the aforementioned pattern transfer process. In addition, two islands 125 are further formed. With reference to FIG. 3G, thereafter, a plurality of pads 138 are further formed to be connected with the first line 130 to the fourth line 136 respectively. The material and forming method of the pads 138 in the second embodiment are the same as the material and forming method in the first embodiment. Thus, details thereof are not repeated here.

With reference to FIG. 3F, FIG. 3G, and FIG. 4F, after the aforementioned removing process, a spacing P4a is formed between an endpoint of an end segment of the first line 130 and an endpoint of an end segment of the second line 132 in the second direction D2; and a spacing P5a is formed between an endpoint of an end segment of the third line 134 and an endpoint of an end segment of the fourth line 136 in the second direction D2. The spacing P4a is a fabrication tolerance between the pad 138 connected with the first line 130 and the pad 138 connected with the second line 132. The spacing P5a is a fabrication tolerance between the pad 138 connected with the third line 134 and the pad 138 connected with the fourth line 136. With reference to FIG. 1E, the spacing P4a and the spacing P5a can be increased by increasing the length L17 of the bottom portion 128a of the first predetermined area 128 in the second direction D2 and the length L19 of the extension area 128b in the second direction D2.

With reference to FIG. 3F and FIG. 3G, the first line 130 to the fourth line 136 formed in the second embodiment of the invention are similar to the first line 30 to the fourth line 36 of the first embodiment, and the end segments of the lines are all in a stepped shape and have the same trend and the same number of steps. In an embodiment, the end segments of the second line 132 and the third line 134 may respectively include the first protrusion portions 126a. A difference is that, in the second embodiment, the end segment of the second line 132 and the end segment of the third line 134 respectively include the first protrusion portions 126a and 126b that extend in the second direction D2 and protrude toward the first line 130 and the fourth line 136 respectively. Further, the end segment of the first line 130 and the end segment of the fourth line 136 respectively include the second protrusion portions 127a and 127b that extend in the second direction D2 and protrude toward the second line 132 and the third line 134 respectively. The islands 125 are respectively formed between the second protrusion portion 127a and the second line 132 and between the second protrusion portion 127a and the third line 134. A length of each of the second protrusion portions 127a and 127b in the second direction D2 is in a range of 5 nm to 50 nm, and a length thereof in the first direction D1 is in a range of 15 nm to 60 nm, for example. In an embodiment, the length of the first protrusion portions 126a and 126b in the second direction D2 is greater than the length of the second protrusion portion 127a in the second direction D2.

Since the spacing respectively between the endpoints of the end segments of the first line 130, the second line 132, the third line 134, and the fourth line 136 connected with the pads 138 is much greater than the spacing respectively between the endpoints of the initial segments of the first line 130, the second line 132, the third line 134, and the fourth line 136 that are not connected with the pads 138, and the end segments of the first line 130 to the fourth line 136 are all in the stepped shape and the steps of the end segments of the second line 132 and the third line 134 have different trends form those of the steps of the end segments of the first line 130 and the fourth line 136, even in the case of erroneous alignment, sufficient fabrication tolerance is obtained in both the longitudinal and the lateral directions.

To sum up, the invention utilizes the core layer formed with auxiliary layers that protrude toward two sides to effectively increase the spacing between the line ends with use of fewer lithography processes, such that the production costs and fabrication complexity are reduced. By forming the auxiliary layers that protrude toward two sides on the core layer, sufficient distances are maintained in the lateral direction, and thus the tolerance for patterning of the lines and formation of the pads is enhanced. Moreover, when multiple sets of auxiliary layers that protrude toward two sides are formed in the extension direction of the core layer, in addition to the fabrication tolerance in the lateral direction, the fabrication tolerance in the longitudinal direction is also improved.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A line layout, comprising:
   a first line, a second line, a third line, and a fourth line respectively extending in a first direction, wherein the second line and the third line are disposed between the first line and the fourth line; and
   a plurality of pads, respectively connected with an end segment of the first line, an end segment of the second line, an end segment of the third line, and an end segment of the fourth line,
   wherein the end segment of the second line and the end segment of the third line respectively comprise a first protrusion portion that extend in a second direction, wherein
   the first protrusion portion of the end segment of the second line protrudes toward the first line; and
   the first protrusion portion of the end segment of the third line protrudes toward the fourth line,
   wherein the end segment of the first line, the end segment of the second line, the end segment of the third line, and the end segment of the fourth line respectively comprise a first stepped shape, a second stepped shape, a third stepped shape, and a fourth stepped shape, in which a number of turns of the second stepped shape is less than a number of turns of the first stepped shape and the fourth stepped shape, and a number of turns of the third stepped shape is less than the number of turns of the first stepped shape and the fourth stepped shape,
   wherein the first line, the second line, the third line, and the fourth line are derived from a single core space, and a region covered by the core space is located between the first line and the fourth line, and overlaps with the second line and the third line.

2. The line layout according to claim 1, wherein:
   a spacing between an endpoint of the end segment of the first line and an endpoint of the end segment of the second line in the second direction is greater than or equal to a sum of a width of the first line and a spacing between an endpoint of an initial segment of the first line and an endpoint of an initial segment of the second line; and
   a spacing between an endpoint of the end segment of the fourth line and an endpoint of the end segment of the third line in the second direction is greater than or equal to a sum of a width of the fourth line and a spacing between an endpoint of an initial segment of the fourth line and an endpoint of an initial segment of the third line.

3. The line layout according to claim 1, wherein:
   a spacing between the endpoint of the end segment of the second line and the endpoint of the end segment of the third line in the second direction is greater than the spacing between the endpoint of the end segment of the first line and the endpoint of the end segment of the second line in the second direction and greater than the spacing between the endpoint of the end segment of the third line and the endpoint of the end segment of the fourth line in the second direction.

4. The line layout according to claim 1, further comprising two islands, wherein
   a first one of the two islands is between the first line and the first protrusion portion of the end segment of the second line; and a second one of the two islands is between the fourth line and the first protrusion portion of the end segment of the third line.

5. The line layout according to claim 1, wherein the end segment of the first line and the end segment of the fourth line respectively comprise two second protrusion portions that extend in the second direction,
   the two second protrusion portions of the end segment of the first line protrudes toward the second line; and
   the two second protrusion portions of the end segment of the fourth line protrudes toward the third line.

6. The line layout according to claim 5, wherein a length of the first protrusion portions in the second direction is greater than a length of the second protrusion portions in the second direction.

7. The line layout according to claim 5, further comprising two islands, wherein
   a first one of the two islands is between the second line and one of the two second protrusion portions of the end segment of the first line; and
   a second one of the two islands is between the third line and one of the two second protrusion portions of the end segment of the fourth line.

8. A line layout, comprising:
   a first line, a second line, a third line, and a fourth line each comprising an end segment having a stepped shape, wherein the second line and the third line are disposed between the first line and the fourth line, and the number of turns of the end segments of the second line is less than the number of turns of the end segments of the first line and the number of turns of the fourth line respectively; and the number of turns of the third line is less than the number of turns of the end segments of the first line and the number of turns of the fourth line respectively; and
   a plurality of pads, respectively connected with the end segment of the first line, the end segment of the second line, the end segment of the third line, and the end segment of the fourth line,
   wherein the first line, the second line, the third line, and the fourth line are derived from a single core space, and a region covered by the core space is located between the first line and the fourth line, and overlaps with the second line and the third line.

9. The line layout according to claim 8, wherein the turns of the end segment of the first line and the turns of the end segment of the second line are in the same trend, and the turns of the end segment of the second line and the turns of the end segment of the third line are in opposite trends.

10. The line layout according to claim 8, wherein the first line, the second line, the third line, and the fourth line respectively extend in a first direction;
   the end segment of the second line and the end segment of the third line respectively comprise two first protrusion portions that extend in a second direction, wherein the two first protrusion portions of the end segment of the second line protrudes toward the first line and the two first protrusion portions of the end segment of the third line protrudes toward the fourth line; and
   the end segment of the first line and the end segment of the fourth line respectively comprise two second protrusion portions that extend in the second direction, wherein the two second protrusion portions of the end segment of the first line protrudes toward the second line and the two second protrusion portions of the end segment of the fourth line protrudes toward the third line.

* * * * *